(12) United States Patent
Shin et al.

(10) Patent No.: US 7,563,639 B2
(45) Date of Patent: Jul. 21, 2009

(54) PHASE-CHANGEABLE MEMORY DEVICE AND METHOD OF MANUFACTURING THE SAME

(75) Inventors: Hee-Ju Shin, Gyeonggi-do (KR); Jong-Chan Shin, Gyeonggi-do (KR); Soon-Oh Park, Gyeonggi-do (KR); Hyeong-Geun An, Gyeonggi-do (KR); Han-Bong Ko, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/733,131

(22) Filed: Apr. 9, 2007

(65) Prior Publication Data

US 2007/0243659 A1 Oct. 18, 2007

(30) Foreign Application Priority Data

Apr. 12, 2006 (KR) ...................... 10-2006-0033239

(51) Int. Cl.
*H01L 21/06* (2006.01)
(52) U.S. Cl. ........................... 438/102; 438/95; 257/42; 257/E21.068
(58) Field of Classification Search ................... 438/95, 438/102; 257/298, 42, E21.068, E21.68
See application file for complete search history.

(56) References Cited

U.S. PATENT DOCUMENTS

| | | | |
|---|---|---|---|
| 6,797,979 B2 | 9/2004 | Chiang et al. | |
| 6,894,304 B2 | 5/2005 | Moore | |
| 2005/0156150 A1* | 7/2005 | Iwasaki et al. | 257/2 |
| 2006/0003263 A1* | 1/2006 | Chang | 430/311 |
| 2006/0113520 A1* | 6/2006 | Yamamoto et al. | 257/3 |
| 2007/0075304 A1* | 4/2007 | Chang et al. | 257/3 |

FOREIGN PATENT DOCUMENTS

JP 2005-32855 2/2005

OTHER PUBLICATIONS

English language abstract of Japanese Publication No. 2005-32855.

\* cited by examiner

*Primary Examiner*—Asok K Sarkar
*Assistant Examiner*—Julia Slutsker
(74) *Attorney, Agent, or Firm*—Marger Johnson & McCollom, P.C.

(57) ABSTRACT

In a semiconductor memory device and a method of manufacturing the same, an insulating layer is formed on a substrate having a logic region on which a first pad is provided and a cell region on which a second pad and a lower electrode are subsequently provided. The insulating layer is etched to be a first insulating layer pattern having a first opening exposing the first pad. A first plug is formed in the first opening. The first insulating layer pattern where the first plug is formed is etched to be a second insulating layer pattern having a second opening exposing the lower electrode. A second plug including a phase-changeable material is formed in the second opening. A conductive wire and an upper electrode are formed on the first plug and the second plug, respectively.

19 Claims, 6 Drawing Sheets

[FIG. 1a]
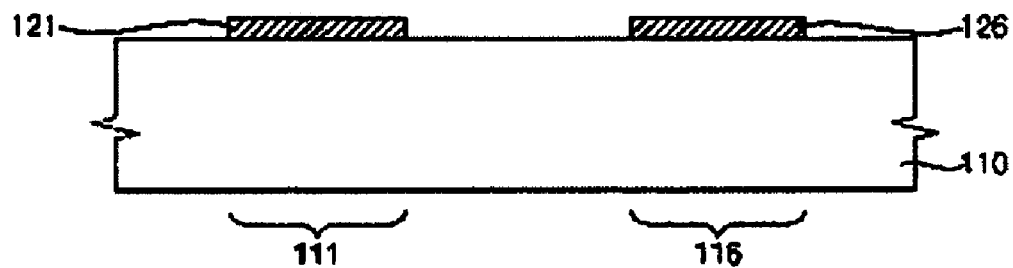
[FIG. 1b]
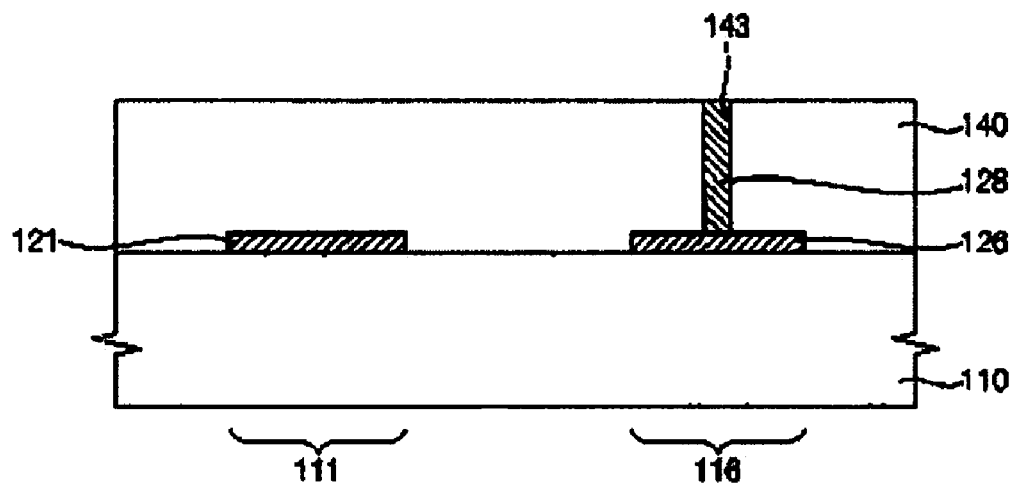
[FIG. 1c]
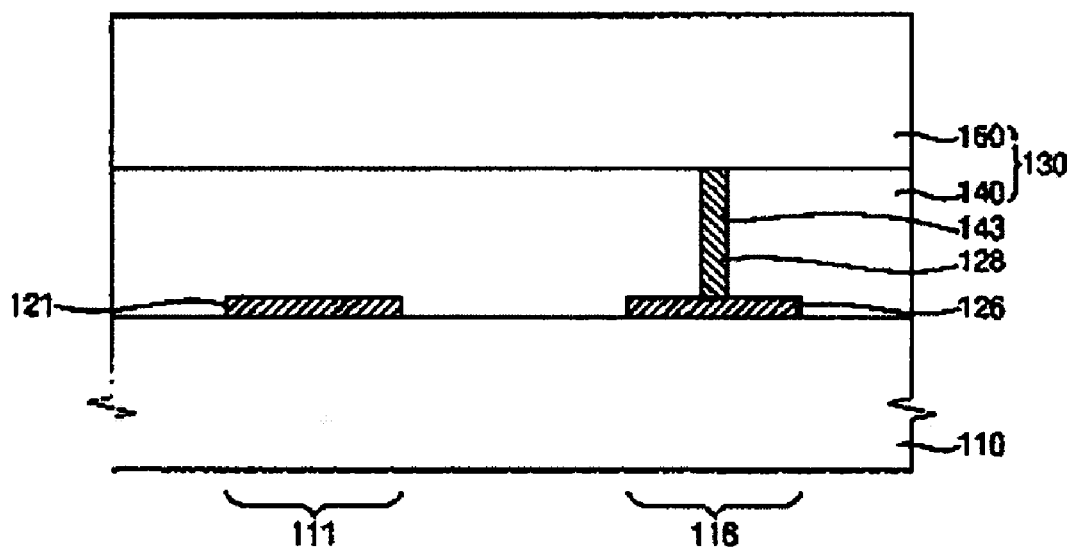

[FIG. 1d]
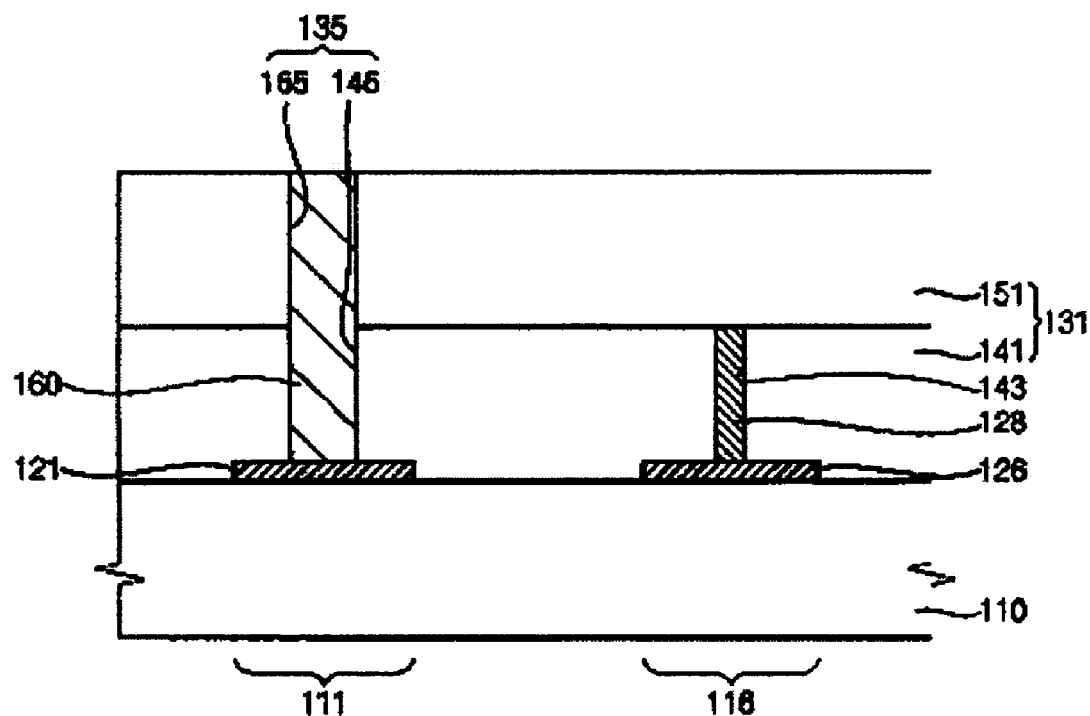
[FIG. 1e]
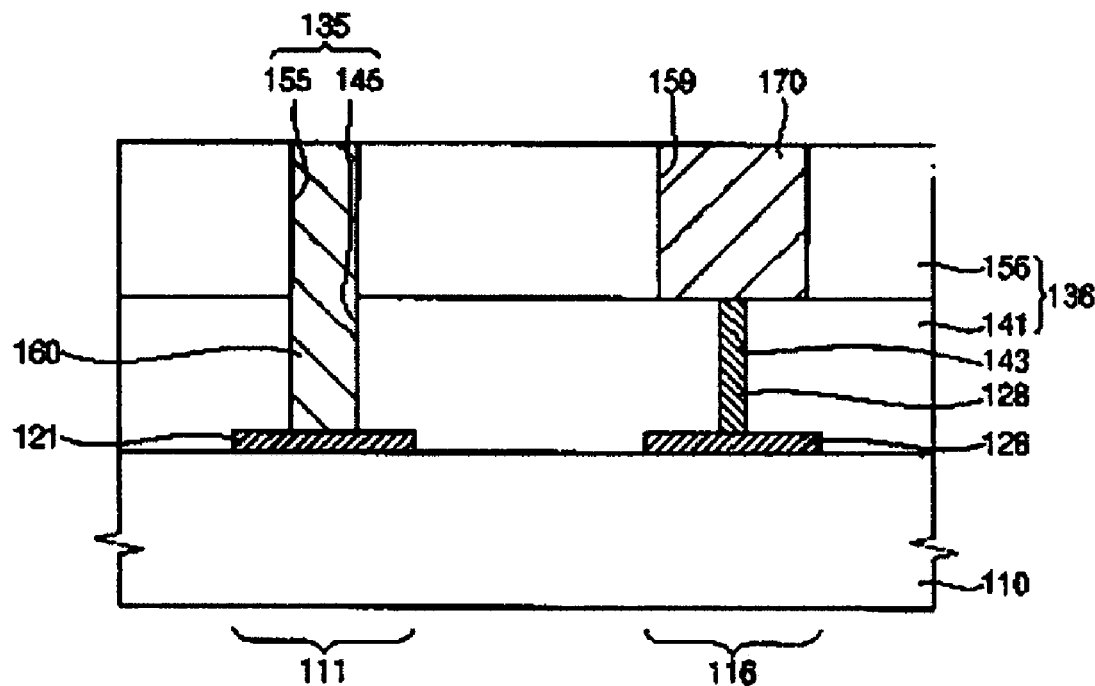

[FIG. 1f]
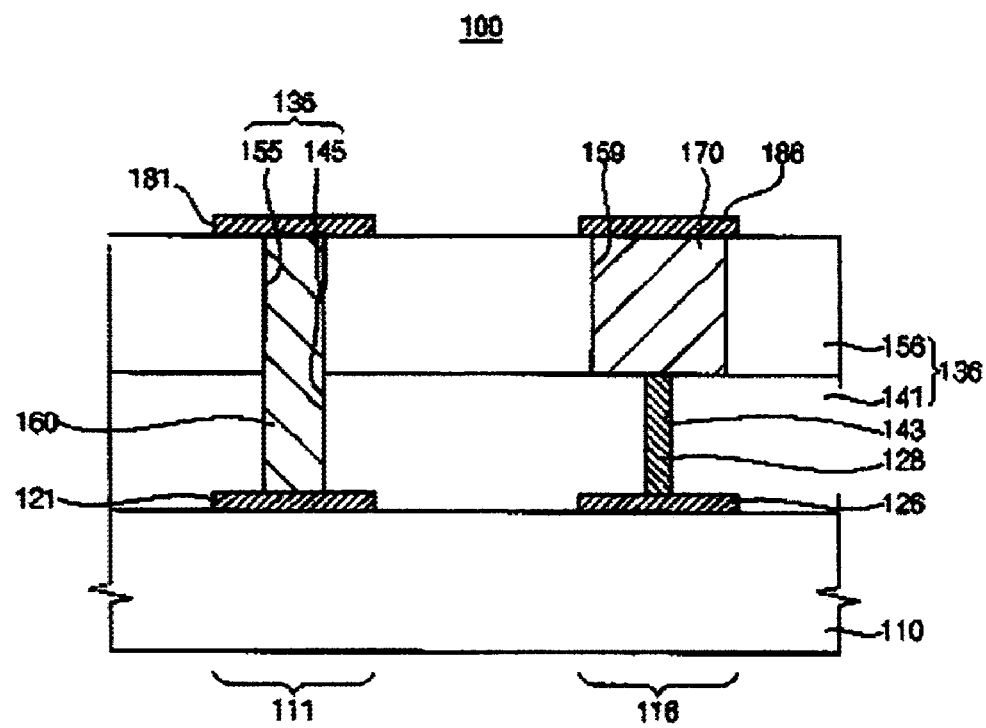
[FIG. 2]
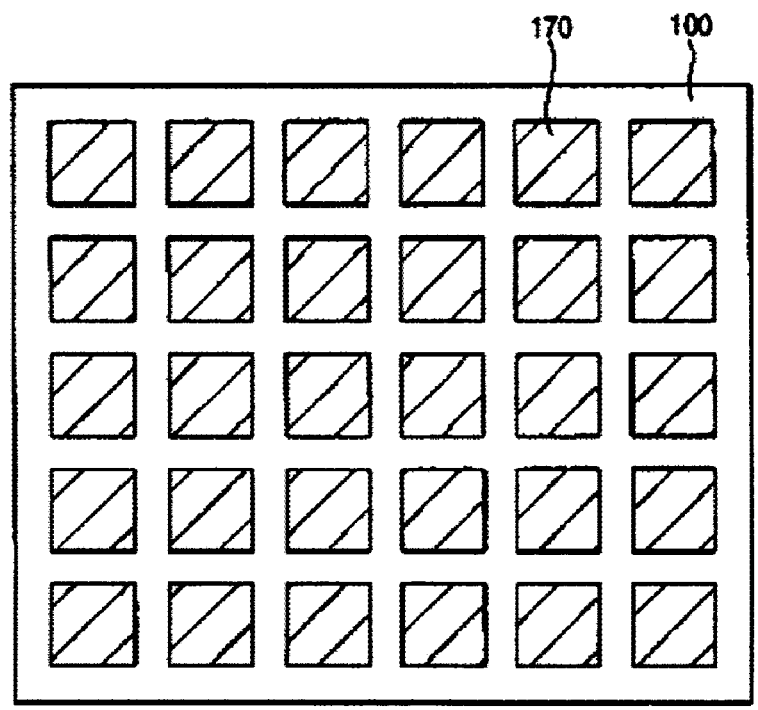

[FIG. 3a]
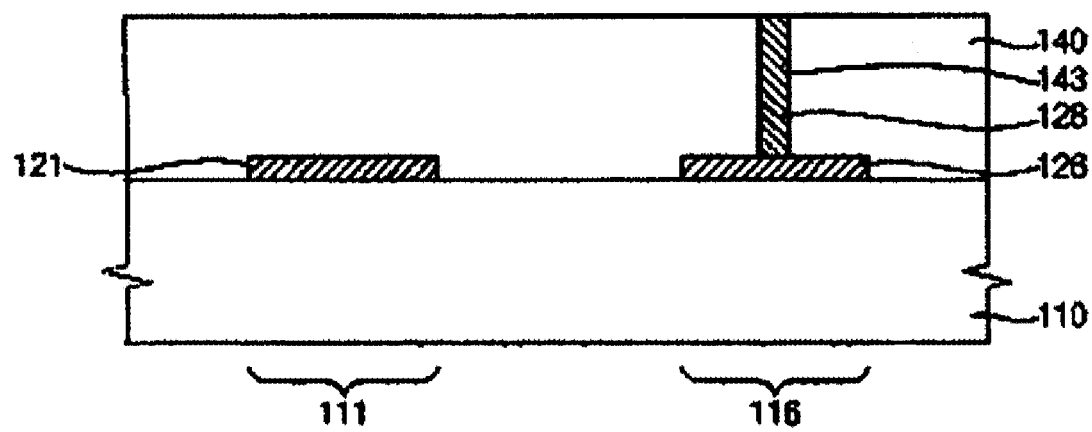
[FIG. 3b]
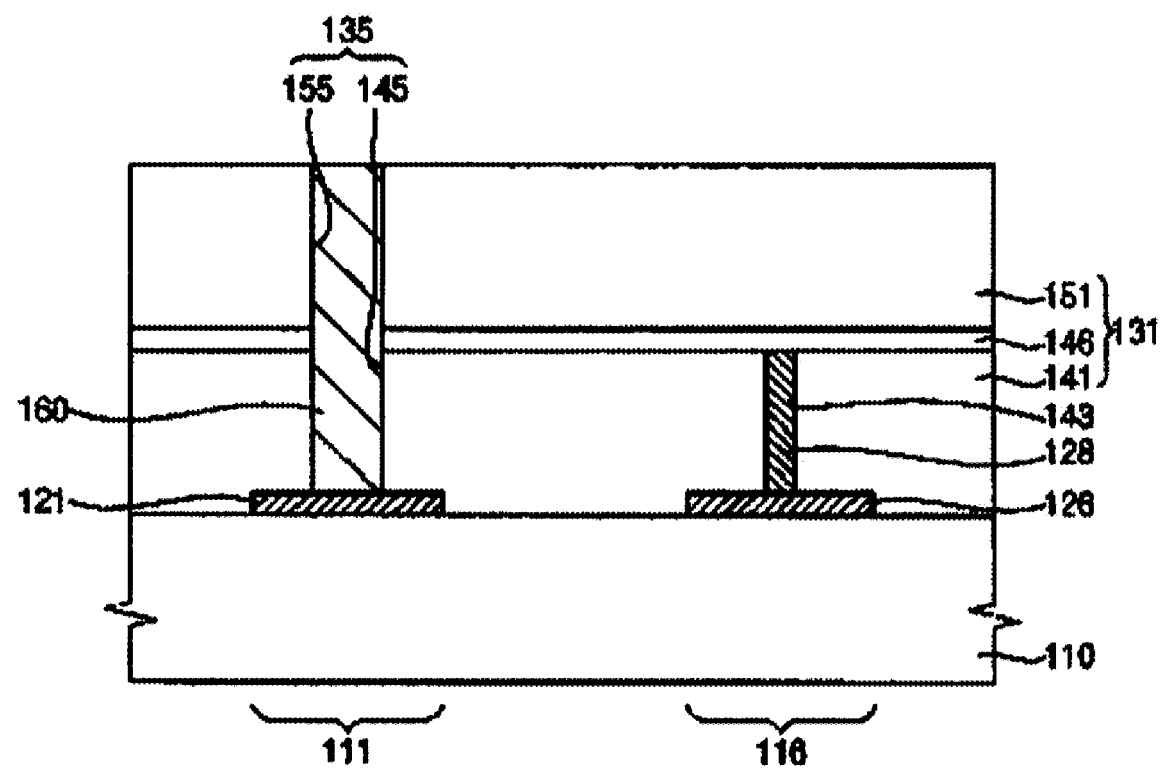

[FIG. 3c]
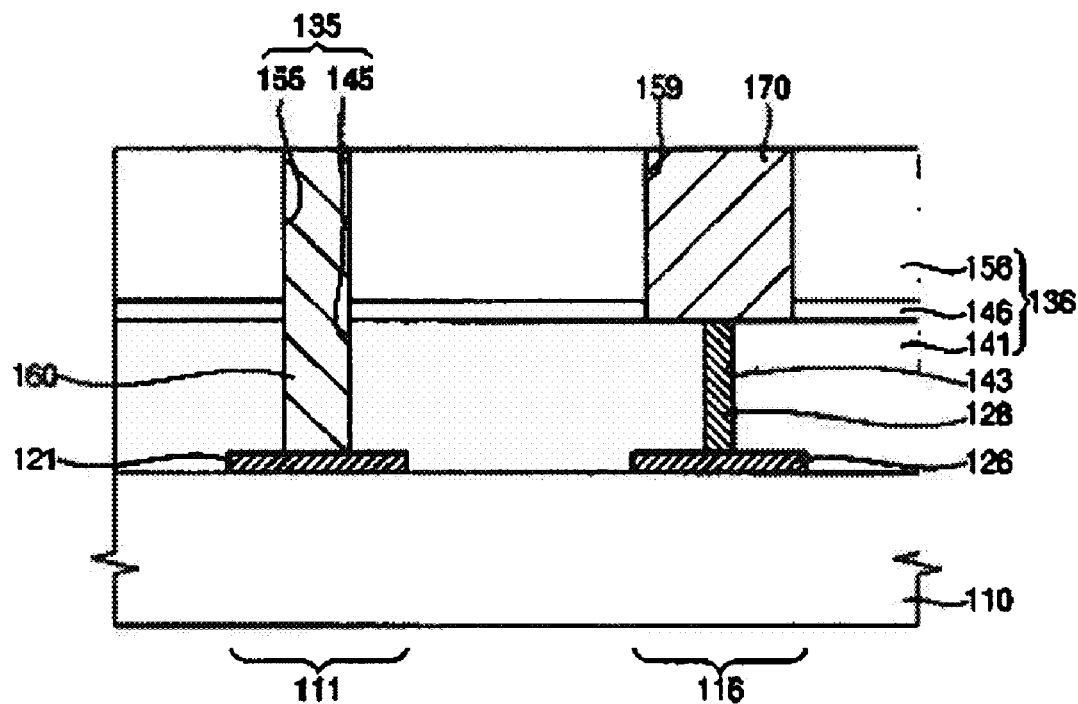
[FIG. 3d]
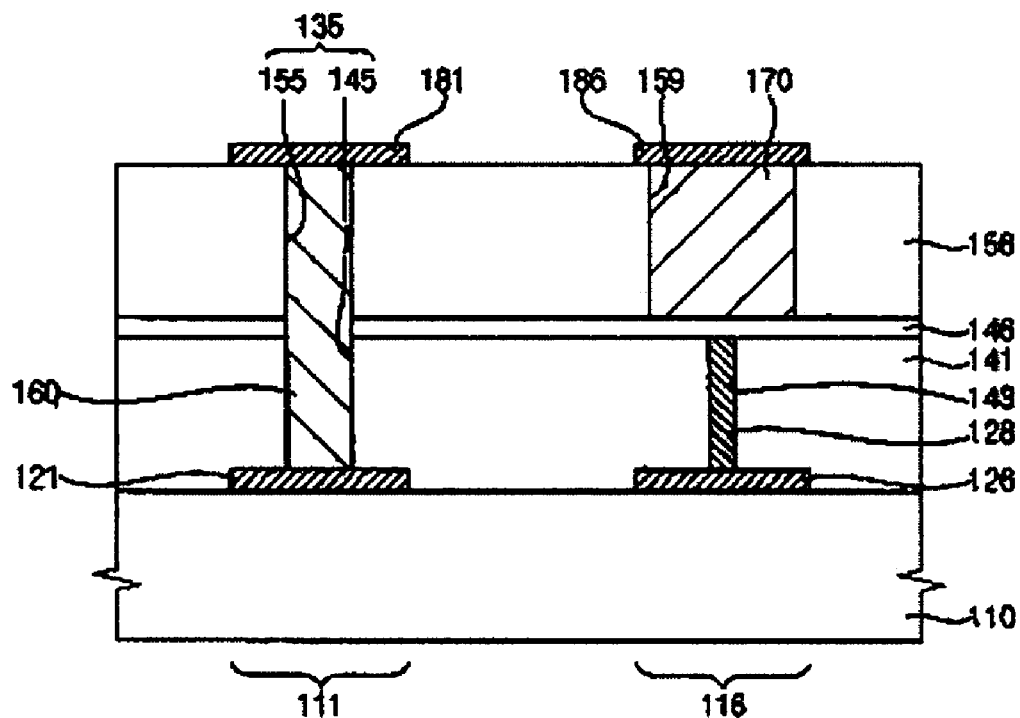

[FIG. 4]
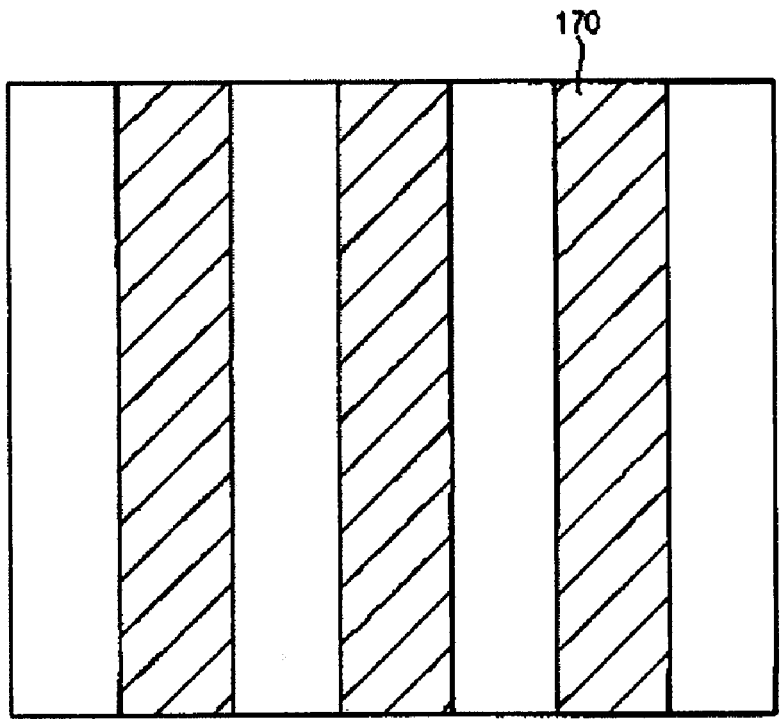
[FIG. 5]
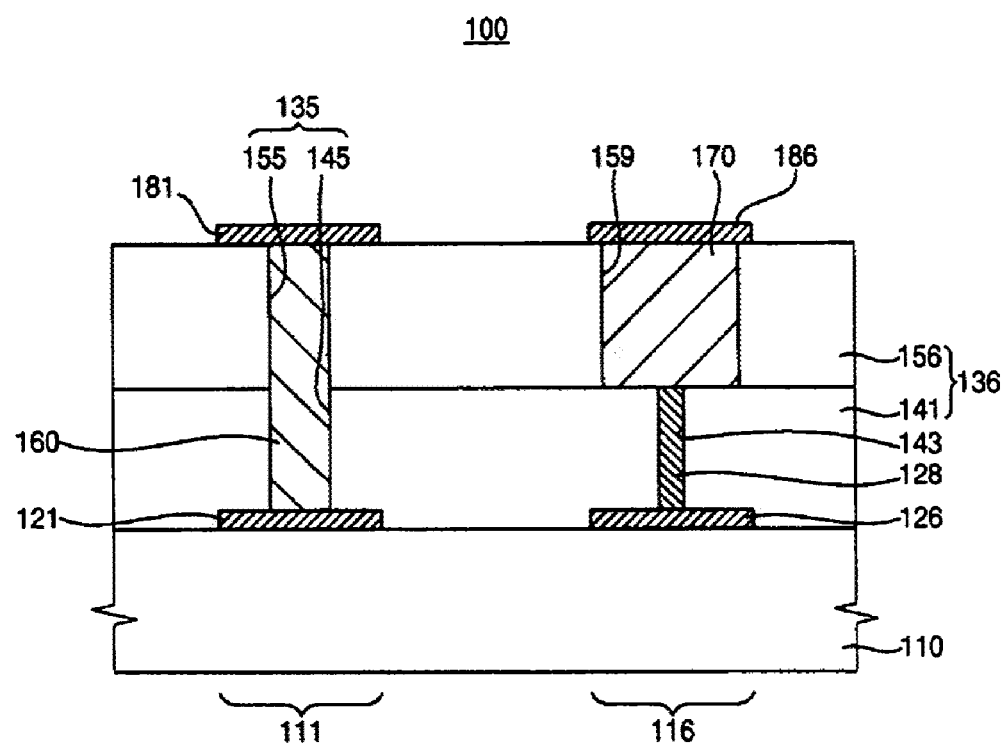

PHASE-CHANGEABLE MEMORY DEVICE AND METHOD OF MANUFACTURING THE SAME

CROSS-REFERENCE TO RELATED APPLICATION

This application claims priority under 35 U.S.C. § 119 to Korean Patent Application No. 10-2006-0033239 filed on Apr. 12, 2006, the disclosure of which is incorporated herein by reference in its entirety.

BACKGROUND

1. Field of Invention

Embodiments of the present invention relate generally to phase-changeable memory devices and methods of manufacturing phase-changeable memory devices. More particularly, the embodiments of the present invention relate to a phase-changeable memory device employing a phase-changeable material and a method of manufacturing the phase-changeable memory device.

2. Description of the Related Art

Typically, a phase-changeable structure includes a lower electrode, a phase-changeable layer pattern and an tipper electrode. The phase-changeable layer pattern is located between the lower electrode and the upper electrode. The phase-changeable layer pattern may include a chalcogenide. When a current generated by a difference in voltage between the lower electrode and the upper electrode is provided to the phase-changeable layer pattern, a phase of the phase-changeable layer pattern may be changed from a single crystalline phase having a relatively low resistance into an amorphous phase having a relatively high resistance. In addition, when the current provided to the phase-changeable layer pattern is removed or reduced by a predetermined amount, the phase of the phase-changeable layer pattern may be changed from the amorphous phase into the single crystalline phase.

The phase-changeable structure including the lower electrode, the phase-changeable layer pattern and the upper electrode may be used as a variable resistance because the phase of the phase-changeable layer pattern may vary.

In a conventional method of manufacturing a phase-changeable structure, a metal nitride layer is formed on a phase-changeable layer after the phase-changeable layer is initially formed on a lower electrode. An etching process is then performed on the metal nitride layer and the phase-changeable layer so that an upper electrode and a phase-changeable layer pattern may be formed.

However, when the upper electrode and the phase-changeable layer pattern are formed by the etching process, an etching material may chemically react with the phase-changeable layer, thereby damaging the phase-changeable layer. As phase-changeable structures become smaller, damage due to etching processes becomes more serious.

SUMMARY

Embodiments of the present invention provide a method of manufacturing a semiconductor memory device capable of reducing damage to a phase-changeable layer caused by an etching process. Embodiments of the present invention also provide a semiconductor memory device capable of reducing damage to a phase-changeable layer.

One embodiment of the present invention can be characterized as a method of manufacturing a semiconductor memory device. In the method, an insulating layer is formed on a substrate having a logic region and a cell region. A first pad is provided on the logic region. A second pad is provided on the cell region. The insulating layer is provided on the substrate to cover the first pad and the second pad. A hole is defined within the insulating layer and a lower electrode is formed within the hole. The insulating layer is etched to form a first insulating layer pattern having a first opening exposing the first pad. A first plug including a metal is formed in the first opening. The first insulating layer pattern, having the first plug formed within the first opening, is etched to form a second insulating layer pattern having a second opening exposing the lower electrode. A second plug including a phase-changeable material is formed in the second opening. A conductive wire and an upper electrode are formed on the first plug and the second plug, respectively.

The conductive wire and the upper electrode may be formed simultaneously. In one embodiment, a conductive layer may be formed on the second insulating layer pattern where the first plug and the second plug are formed. The conductive layer may be etched to transform the conductive layer into the conductive wire located on the first plug and the upper electrode located on the second plug. Here, the conductive layer may include a material such as tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, and/or tantalum aluminum nitride.

The insulating layer may have a multi-layered structure. The insulating layer may, for example, include a lower insulating layer and an upper insulating layer. The upper insulating layer may have an etching selectivity with respect to the lower insulating layer.

In one embodiment, a single lower electrode may be connected to the second plug. In another embodiment, a plurality of lower electrodes may be connected to the second plug.

The second plug may include a material such as germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), tantalum-antimony-tellurium (Ta—Sb—Te), niobium-antimony-tellurium (Nb—Sb—Te), vanadium-antimony-tellurium (V—Sb—Te), tungsten-antimony-tellurium (W—Sb—Te), molybdenum-antimony-tellurium (Mo—Sb—Te), chromium-antimony-tellurium (Cr—Sb—Te), tantalum-antimony-selenium (Ta—Sb—Se), niobium-antimony-selenium (Nb—Sb—Se), vanadium-antimony-selenium (V—Sb—Se), tungsten-antimony-selenium (W—Sb—Se), molybdenum-antimony-selenium (Mo—Sb—Se), indium-antimony-tellurium-silver (In—Sb—Te—Ag), chromium-antimony-selenium (Cr—Sb—Se) or a combination thereof.

Another embodiment of the present invention can be characterized as a semiconductor memory device including a substrate, a first pad, a second pad, a lower electrode, a first plug and a second plug. The substrate has a logic region and a cell region. The first pad is located over the logic region. The second pad is located over the cell region. The lower electrode is located on the second pad. The first plug is located on the first pad. The first plug includes a metal. The second plug is located on the lower electrode. The second plug has a surface that is substantially coplanar with a surface of the first plug. The second plug includes a phase-changeable material.

An upper surface of the first pad may be substantially coplanar with an upper surface of the second pad. One or more lower electrodes may be connected to the second plug.

Another embodiment of the present invention can be characterized as a semiconductor memory device including a substrate, an insulating layer pattern over the substrate, a lower electrode, a first plug, and a second plug including phase-changeable material. The insulating layer pattern may include a lower insulating layer pattern and an upper insulating layer pattern over the lower insulating layer pattern, and at least two layers having an etching selectivity with respect to each other. The lower insulating layer pattern may include a hole and a lower opening defined therethrough and the upper insulating layer pattern may include an upper opening defined therethrough in communication with the lower opening to form a first opening as well as a second opening defined therethrough in communication with the hole. A width of the second opening may be greater than a width of the hole. The lower electrode may be within the hole, the first plug may be within the first opening, and the second plug may be within the second opening.

According to the embodiments exemplarily described herein, the second plug including the phase-changeable material is formed in an opening so that the second plug may not be exposed to etching processes. Thus, damage to the second plug may be minimized. In addition, the second plug having the phase-changeable material is formed after a first plug connected to a first pad is formed. Thus, the phase-changeable material may not be exposed during etching processes required for forming the first contact, thereby minimizing damage to the second plug caused by the etching process. In addition, a protecting layer for protecting the second plug may not be required. Thus, processes of manufacturing a semiconductor device employing the phase-changeable material may be simplified.

BRIEF DESCRIPTION OF THE DRAWINGS

The above and other advantages of embodiments exemplarily described herein will become readily apparent by reference to the following detailed description when considered in conjunction with the accompanying drawings in which:

FIGS. 1A to 1F are cross-sectional views illustrating a method of manufacturing a semiconductor memory device in accordance with an embodiment of the present invention;

FIG, 2 is a plan view illustrating a second plug shown in FIG. 1E;

FIGS. 3A to 3D are cross-sectional views illustrating a method of manufacturing a semiconductor memory device in accordance with another embodiment of the present invention;

FIG. 4 is a plan view illustrating a second plug shown in FIG. 3C; and

FIG. 5 is a cross-sectional view illustrating a semiconductor memory device in accordance with an embodiment of the present invention.

DETAILED DESCRIPTION

Embodiments of the present invention will be exemplarily described with reference to the accompanying drawings. These embodiments may, however, be realized in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include a fourth member, whereas the expression "at least one selected from the group consisting of A, B, and C" does not.

As used herein, the expression "or" is not an "exclusive or" unless it is used in conjunction with the phrase "either." For example, the expression "A, B, or C" includes A alone; B alone; C alone; both A and B together: both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together."

Embodiments of the present invention are described with reference to cross-sectional views that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

FIGS. 1A to 1F are cross-sectional views illustrating a method of manufacturing a semiconductor memory device in accordance with an embodiment of the present invention. FIG. 2 is a plan view illustrating a second plug shown in FIG. 1E.

Referring to FIG. 1A, a substrate 110 may include a cell region 116 and a logic region 111. A data may be stored in the cell region 116. Thus, a memory unit such as a phase-changeable memory unit may be formed within the cell region 116. The logic region 111 may be adjacent to the cell region 116. A signal transferring unit such as a signal wire may be formed within the logic region 111. The signal transferring unit may be used for receiving a signal from the outside or outputting a signal to the outside.

Although not illustrated in the drawings, a switching unit such as a transistor may be formed in the substrate 110. An electric signal generated from the switching unit may be used for an operation of the memory unit.

A first conductive layer (not shown) may be formed on the substrate 110. A first photoresist pattern (not shown) may be formed on the first conductive layer and the first conductive layer may then be etched using the first photoresist pattern as an etch mask. Thus, the first conductive layer may be transformed into first and second pads 121 and 126. Here, the first pad 121 and the second pad 126 are to be connected to a first plug 160 (see FIG. 1D) and a lower electrode 128 (see FIG. 1B), respectively. The first conductive layer may include a metal such as copper, aluminum, or the like.

The first pad 121 may be formed such that the first pad 121 corresponds to the logic region 111. The first pad 121 may receive an external signal and transfer the signal to the memory unit formed within the cell region 116. In addition, the first pad 121 may receive a signal from the memory unit and transfer the signal to the outside. The second pad 126 is formed such that the second pad 126 corresponds to the cell region 116. The second pad 126 may be used to apply a voltage to the memory unit that is subsequently formed.

Referring to FIG. 1B, a lower insulating layer 140 may be formed on the substrate 110 including the first and second pads 121 and 126 to cover the first and second pads 121 and 126. The lower insulating layer 140 may include a material such as an oxide, a nitride, or the like. For example, the lower insulating layer 140 may include PSG (phosphor silicate glass), BPSG (boro-phosphor silicate glass), USG (undoped silicate glass), SOG (spin-on-glass), TEOS (tetra-ethyl-ortho-silicate), PE-TEOS (plasma-enhanced TEOS), FOX (flowable oxide), HDP-CVD (high-density plasma chemical vapor deposition) oxide, silicon nitride, or the like. In addition, a hole 143 exposing the second pad 126 may be formed through the lower insulating layer 140.

The lower electrode 128 is then formed in the hole 143. The lower electrode 128 may be electrically connected to the second pad 126.

Particularly, a second conductive layer (not shown) is formed on the lower insulating layer 140 to fill up the hole 143. The second conductive layer may then be planarized until an upper surface of the lower insulating layer 140 is exposed, thereby forming the lower electrode 128 in the hole 143. The second conductive layer may be planarized by a chemical mechanical polishing (CMP) process and/or an etch-back process.

The lower electrode 128 may include a material capable of generating heat when a current is applied to the material. In addition, the material may have suitable gap-filling characteristics. For example, the lower electrode 128 may, for example, include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, and/or tantalum aluminum nitride, or the like. In another example, the lower electrode 128 may include a material such as polysilicon doped with impurities.

Referring to 1C, an upper insulating layer 150 may be formed on the lower insulating layer 140 where the lower electrode 128 is formed. Thus, an insulating layer 130, including the upper and lower insulating layers 150 and 130, may be formed. The insulating layer 130 may have a multi-layered structure such as a double-layered structure.

The upper insulating layer 150 may have a thickness corresponding to a height of a second plug 170 (see FIG. 1E) that is subsequently formed. For example, the thickness of the upper insulating layer 150 may be about 100 Å to about 1000 Å. The upper insulating layer 150 may include a material such as PSG (phosphor silicate glass), BPSG (boro-phosphor silicate glass), USG (undoped silicate glass), SOG (spin-on-glass), TEOS (tetra-ethyl-ortho-silicate), PE-TEOS (plasma-enhanced TEOS), FOX (flowable oxide), HDP-CVD (high-density plasma chemical vapor deposition) oxide or the like. In one embodiment, the upper insulating layer 150 may include a material having an etching selectivity with respect to a material included within the lower insulating layer 140. When the upper insulating layer 150 includes a material having an etching selectivity with respect to a material included within the lower insulating layer 140, a second opening 159 (see FIG. 1E) that is filled with the second plug 170 may be efficiently formed. For example, when the lower insulating layer 140 includes a nitride or a silicon oxynitride, the upper insulating layer 150 may include an oxide.

Referring to FIG. 1D, the upper insulating layer 150 and the lower insulating layer 140 are partially etched so that the upper insulating layer 150 and the lower insulating layer 140 may be transformed into a first upper insulating layer pattern 151 and a lower insulating layer pattern 141, respectively. An upper opening 155 and a lower opening 145 may be defined within the first upper insulating layer pattern 151 and the lower insluting layer pattern 141, respectively. Here, a first opening 135 exposes the first pad 121 includes the upper opening 155 and the lower opening 145. In addition, a first insulating layer pattern 131 includes the first upper insulating layer pattern 151 and the lower insulating layer pattern 141.

In one embodiment, a second photoresist pattern (not shown) is formed on the upper insulating layer 150. The upper insulating layer 150 and the lower insulating layer 140 are then etched using the second photoresist pattern as an etch mask. When the upper insulating layer 150 has an etching selectivity with respect to the lower insulating layer 140, the upper insulating layer 150 is initially etched and the lower insulating layer 140 is subsequently etched. Thus, the first upper insulating layer pattern 151, having the upper opening 155, and the lower insulating layer pattern 141, having the lower opening 145 that communicates with (i.e., is aligned with) the upper opening 155 to expose the first pad 121, are subsequently formed.

A first plug 160 substantially filling the first opening 135 may be formed after the first opening 135 including the upper opening 155 and the lower opening 145 is formed. The first plug 160 may be electrically connected to the first pad 121.

In one embodiment, a third conductive layer (not shown) may be formed on the first upper insulating layer pattern 151 to fill up the first opening 135. The third conductive layer may include a material such as doped polysilicon, metal, or metal nitride having suitable conductivity. The metal may include, for example, tantalum (Ta), copper (Cu), tungsten (W), titanium (Ti), aluminum (Al), or the like. The third conductive layer may be formed by a chemical vapor deposition (CVD) process, a physical vapor deposition (PVD) process, an atomic layer deposition (ALD) process or the like. The PVD process may be, for example, a sputtering process.

Thereafter, the third conductive layer may be planarized until an upper surface of the first upper insulating layer pattern 151 is exposed so that the first plug 160 substantially filling the first opening 135 may be formed. The first plug 160 may electrically connect to a subsequently formed conductive wire to the first pad 121.

Referring to FIG. 1E, the first upper insulating layer pattern 151 may be etched after the first plug 160 is formed. Thus, the first upper insulating layer pattern 151 may be transformed into a second upper insulating layer pattern 156 having the second opening 159. The second opening 159 may expose the lower electrode 128. In one embodiment, the second opening 159 may expose an upper surface of the lower electrode 128 and/or a portion of the lower insulating layer pattern 141 adjacent to the upper surface of the lower electrode 128. Thus, a width of a subsequently formed second plug 170 may be greater than a width of the lower electrode 128.

Referring to FIGS. 1E and 2, a plurality of cells are formed at the cell region 116. The cells may store data. The number of second openings 159 within the second upper insulating layer pattern 156 may correspond to the number of cells within the cell region 116. Thus, the number of second plugs 170 that are subsequently formed in the second openings 159 may correspond to the number of cells. In the illustrated embodiment, each second plug 170 may be connected to a corresponding lower electrode 128. Accordingly, each second plug 170 may be connected to one of a plurality of lower electrodes 128.

Referring again to FIG. 1E, the second plug 170 may be formed in the second opening 159. A phase of the second plug 170 may be changed from an amorphous phase to a crystalline phase or from the crystalline phase to the amorphous phase in accordance with the amount or type of a voltage applied to the second plug 170. A phase change of the second plug 170 may change an electric resistance of the second plug 170. Thus, a current flowing through the second plug 170 may also vary such that data may be stored or removed.

The second plug 170 may include a phase-changeable material such as a chalcogenide. The chalcogenide may, for example, include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), tantalum-antimony-tellurium (Ta—Sb—Te), niobium-antimony-tellurium (Nb—Sb—Te), vanadium-antimony-tellurium (V—Sb—Te), tungsten-antimony-tellurium (W—Sb—Te), molybdenum-antimony-tellurium (Mo—Sb—Te), chromium-antimony-tellurium (Cr—Sb—Te), tantalum-antimony-selenium (Ta—Sb—Se), niobium-antimony-selenium (Nb—Sb—Se), vanadium-antimony-selenium (V—Sb—Se), tungsten-antimony-selenium (W—Sb—Se), molybdenum-antimony-selenium (Mo—Sb—Se), indium-antimony-tellurium-silver (In—Sb—Te—Ag) and/or chromium-antimony-selenium (Cr—Sb—Se). The second plug 170 may have the amorphous phase or the crystalline phase.

In one embodiment, a phase-changeable layer (not shown) is formed on the second upper insulating layer pattern 156 to substantially fill the second opening 159. Any process capable of filling up the second opening 159 without forming a void or seam may be employed to form the phase-changeable layer. For example, the phase-changeable layer may be formed by a sputtering process, a chemical vapor deposition process or an atomic layer deposition process.

The phase-changeable layer may be planarized (e.g., by a chemical mechanical polishing process) until an upper surface of the second upper insulating layer pattern 156 is exposed so that the second plug 170 may be formed in the second opening 159. Accordingly, the second plug 170 may be formed in the second opening 159 without performing an etching process. Thus, an etching material used in the etching process does not damage the second plug 170. Accordingly, an electric characteristic of the second plug 170 may not be deteriorated.

In one embodiment, the first opening 135 may be formed within the logic region 111. The first plug 160 may then be formed in the first opening 135 to be electrically connected to the first pad 121. Thereafter, the second upper insulating layer pattern 156, having the second opening 159 formed within the cell region 116 and exposing the lower electrode 128 is formed. Thus, the second plug 170 including the phase-changeable material is formed within the cell region 116 after the first plug 160 is formed within the logic region 111. As a result, etching processes capable of damaging the second plug 170 are not performed. Accordingly, the second plug 170 may not be deteriorated. In addition, use of a protecting member (e.g., a hard mask pattern) for protecting the second plug 170 during etching processes may not be necessary. Thus, processes of for manufacturing a semiconductor device that employs the phase-changeable material may be simplified.

Referring to FIG. 1F, a conductive wire 181 and an upper electrode 186 are formed on the first plug 160 and the second plug 170, respectively. The upper electrode 186 and the lower electrode 128 may be used to apply a predetermined voltage to the second plug 170 so that data may be stored.

In one embodiment, a fourth conductive layer (not shown) may be formed on the first plug 160, the second plug 170 and the second upper insulating layer pattern 156. A third photoresist pattern (not shown) may be formed on the fourth conductive layer and the fourth conductive layer may be partially etched using the fourth photoresist pattern as an etch mask. Thus, the conductive wire 181 and the upper electrode 186 are formed on the first plug 160 and the second plug 170.

An upper surface of the first plug 160 may be substantially coplanar with an upper surface of the second plug 170. Thus, a planarizing layer typically used when a stepped portion is formed between the first and second plugs 160 and 170 may not be required. Accordingly, the upper electrode 186 and the conductive wire 181 that are connected to the second plug 170 and the first plug 160, respectively, may be efficiently formed.

FIGS. 3A to 3D are cross-sectional views illustrating a method of manufacturing a semiconductor memory device in accordance with an embodiment of the present invention. FIG. 4 is a plan view illustrating a second plug shown in FIG. 3C.

Referring to FIG. 3A, a substrate 110 may includes a cell region 116 and a logic region 111. Although not illustrated in the drawings, a switching unit such as a transistor may be formed in the substrate 110.

A first conductive layer (not shown) may be formed on the substrate 110. A first photoresist pattern (not shown) may be formed on the first conductive layer and the first conductive layer may then be etched using the first photoresist pattern as an etch mask so that the conductive layer may be transformed into a first pad 121 and a second pad 126 on the substrate 110. The first and second pads 121 and 126 may be subsequently electrically connected to a first plug 160 (see FIG. 3B) and a lower electrode 128, respectively. The first conductive layer may include a metal such as copper, aluminum, or the like. The first pad 121 may correspond to the logic region 111 and the second pad 126 may correspond to the cell region 116.

Thereafter, a lower insulating layer 140 may be formed on the substrate 110 including the first pad 121 and the second pad 126 to cover the first pad 121 and the second pad 126. The lower insulating layer 140 may include a material such as an oxide, a nitride, or the like. A hole 143 exposing the second pad 126 may be formed through the lower insulating layer 140.

A lower electrode 128 may be formed in the hole 143 and may be electrically connected to the second pad 126. The lower electrode 128 may include a material capable of generating heat when a current is applied to the material. In addition, the material may have suitable gap-filling characteristics.

Referring to FIG. 3B, an etch stop layer 146 may be formed on the lower insulating layer 140 where the lower electrode 128 is formed. The etch stop layer 146 may include a material having an etching selectivity with respect to a subsequently formed upper insulating layer (not shown). When the upper insulating layer includes a material such as an oxide, the etch stop layer 146 may include a material such as a nitride.

The upper insulating layer is then formed on the etch stop layer 146. Thus, an insulating layer including the upper insulating layer, the etch stop layer 146 and the lower insulating layer 140 is formed. The insulating layer may have a multi-layered structure such as a triple-layered structure.

The upper insulating layer may have a thickness corresponding to a height of a second plug 170 (see FIG. 3C) that is subsequently formed. For example, the thickness of the upper insulating layer may be about 100 Å to about 1000 Å.

The upper insulating layer may have an etching selectivity with respect to the etch stop layer 146. When the upper insulating layer has the etching selectivity with respect to the etch stop layer 146, a second opening 159 (see FIG. 3C) for subsequently forming the second plug 170 may be efficiently formed. For example, when the etch stop layer 146 includes a material such as a nitride or a silicon oxynitride, the upper insulating layer may include a material such as an oxide.

The upper insulating layer, the etch stop layer 146 and the lower insulating layer 130 may be etched so that a first upper insulating layer pattern 151 and a lower insulating layer pattern 142 that have an upper opening 155 and a lower opening 145, respectively, are formed. The first opening 135 exposing the first pad 121 may include the upper opening 155 and the lower opening 145. In addition, the first insulating layer pattern 131 may include the first upper insulating layer pattern 151, the etch stop layer 146 and the lower insulating layer pattern 141.

After the first opening 135 is formed, the first plug 160 may be formed in the first opening 135. Thus, the first plug 160 may be electrically connected to the first pad 121.

In one embodiment, a third conductive layer may be formed on the first upper insulating layer pattern to substantially fill the first opening 135. The third conductive layer may include a material such as doped polysilicon, metal or metal nitride having suitable conductivity. The metal may include, for example, tantalum (Ta), copper (Cu), tungsten (W), titanium (Ti), aluminum (Al), or the like.

Thereafter, the third conductive layer may be planarized until an upper surface of the first upper insulating layer pattern 151 is exposed so that the first plug 160 is formed in the first opening 135. The first plug 160 may electrically connect to a conductive wire that is subsequently formed over the first pad 121.

Referring to FIGS. 3C and 4, a plurality of cells may be formed within the cell region 116. The cells may store data. In one embodiment, the cells may linearly extend along a direction. In another embodiment, the second openings 159 may correspond to respective ones of the cells. Thus, the second plugs 170 that are subsequently formed in the second openings 159 may correspond to respective ones of the cells. In one embodiment, the second openings 159 may be stripe-shaped. That is, second openings 159 may linearly extend like the cells. In the illustrated embodiment, each second plug 170 may be connected to a plurality of (e.g., at least two) lower electrodes 128.

Referring again to FIG. 3C, the second plug 170 may be formed in the second opening 159. A phase of the second plug 170 may be changed from an amorphous phase to a crystalline phase or from the crystalline phase to the amorphous phase in accordance with the amount or type of a voltage applied to the second plug 170. A phase change of the second plug 170 may change an electric resistance of the second plug 170. Thus, a current flowing through the second plug 170 may also vary such that data may be stored or removed.

The second plug 170 may include a phase-changeable material such as a chalcogenide. In one embodiment, a phase-changeable layer (not shown) may be formed on the second upper insulating layer pattern 156 to substantially fill the second opening 159. Here, a process capable of substantially filling the second opening 159 without a void or a seam may be employed to form the phase-changeable layer. For example, the phase-changeable layer may be formed by a sputtering process, a chemical vapor deposition process or an atomic layer deposition process.

The phase-changeable layer may be planarized (e.g., by a chemical mechanical polishing process) until an upper surface of the second upper insulating layer pattern 156 is exposed so that the second plug 170 may be formed in the second opening 159.

The first opening 135 is formed within the logic region 111. The first plug 160 is then formed in the first opening 135 to be electrically connected to the first pad 121. Thereafter, the second upper insulating layer pattern 156, having the second hole 159 that exposes the lower electrode 128 formed within the cell region 116, is formed. Thus, the second plug 170 including the phase-changeable material may be formed within the cell region 116 after the first plug 160 is formed within the logic region 111. As a result, etching processes capable of damaging the second plug 170 are not performed. Accordingly, the second plug 170 may not be deteriorated. In addition, a protecting member (e.g., a hard mask pattern) for protecting the second plug 170 during etching processes may not be necessary. Thus, processes of manufacturing a semiconductor device that employs the phase-changeable material may be simplified.

Referring to FIG. 3D, a conductive wire 181 and an upper electrode 186 are formed on the first plug 160 and the second plug 170, respectively. The upper electrode 186 and the lower electrode 128 may be used to apply a predetermined voltage to the second plug 170 so that data may be stored.

In one embodiment, a fourth conductive layer (not shown) may be formed on the first plug 160, the second plug 170 and the second upper insulating layer pattern 156. A third photoresist pattern (not shown) may be formed on the fourth conductive layer and the fourth conductive layer may be partially etched using the fourth photoresist pattern as an etch mask. Thus, the conductive wire 181 and the upper electrode 186 are formed on the first plug 160 and the second plug 170.

An upper surface of the first plug 160 may be substantially coplanar with an upper surface of the second plug 170. Thus, a planarizing layer typically used when a stepped portion is formed between the first and second plugs 160 and 170 may not be required. Accordingly, the upper electrode 186 and the conductive wire 181 connected to the second plug 170 and the first plug 160, respectively, may be efficiently formed.

FIG. 5 is a cross-sectional view illustrating a semiconductor memory device in accordance with an embodiment of the present invention.

Referring to FIG. 5, a phase-changeable memory device 100 includes a substrate 110, a first pad 121, a second pad 126, a lower electrode 128, a first plug 160, a second plug 170, a conductive wire 181 and an upper electrode 186. Here, the first pad 121 and the second pad 126 are connected to the first plug 160 and the lower electrode 128, respectively.

The substrate 110 includes a cell region 116 and a logic region 111. Data may be stored in the cell region 116. Thus, a memory unit such as a phase-changeable memory unit may be formed within the cell region 116. The logic region 111 may be adjacent to the cell region 116. A signal transferring unit such as a signal wire may be formed within the logic region 111. The signal transferring unit may be used for receiving external signals or outputting signals to the outside. Although not illustrated in the drawings, a switching unit such as a transistor may be formed in the substrate 110.

The first pad 121 is formed over the logic region 111. The first pad 121 may include a metal such as copper, aluminum, or the like. The first pad 121 may receive an external signal and transfer the signal to the memory unit formed within the cell region 116. In addition, the first pad 121 may receive a signal from the memory unit and transfer the signal to the outside.

The second pad 126 is formed over the cell region 116. The second pad 126 may be used to apply a voltage to a memory unit. An upper surface of the second pad 126 may be substantially coplanar with an upper surface of the first pad 121.

The lower electrode 128 is formed on the second pad 126 so that the lower electrode 128 may be electrically connected to the second pad 126. The lower electrode 128 may include a material capable of generating heat when a current is applied to the material. In addition, the material may have suitable gap-filling characteristics. For example, the lower electrode 128 may, for example, include tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride and/or tantalum aluminum nitride, or the like. In another embodiment, the lower electrode 128 may include a material such as polysilicon doped with impurities.

The first plug 160 is formed on the first pad 121. Thus, the first plug 160 is electrically connected to the first pad 121. The first plug 160 may include a material such as doped polysilicon, metal or metal nitride having suitable conductivity. The metal may, for example, include tantalum (Ta), copper (Cu), tungsten (W), titanium (Ti), and/or aluminum (Al), or the like.

The second plug 170 is formed on the lower electrode 128. An upper surface of the second plug 170 may be substantially coplanar with an upper surface of the first plug 160. A phase of the second plug 170 may be changed from an amorphous phase to a crystalline phase or from the crystalline phase to the amorphous phase in accordance with the amount or type of a voltage applied to the second plug 170. A phase change of the second plug 170 may alter an electric resistance of the second plug 170. Thus, a current flowing through the second plug 170 may also vary such that a data may be stored or removed.

The second plug 170 may include a phase-changeable material such as a chalcogenide. Here, the chalcogenide may, for example, include germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), tantalum-antimony-tellurium (Ta—Sb—Te), niobium-antimony-tellurium (Nb—Sb—Te), vanadium-antimony-tellurium (V—Sb—Te), tungsten-antimony-tellurium (W—Sb—Te), molybdenum-antimony-tellurium (Mo—Sb—Te), chromium-antimony-tellurium (Cr—Sb—Te), tantalum-antimony-selenium (Ta—Sb—Se), niobium-antimony-selenium (Nb—Sb—Se), vanadium-antimony-selenium (V—Sb—Se), tungsten-antimony-selenium (W—Sb—Se), molybdenum-antimony-selenium (Mo—Sb—Se), indium-antimony-tellurium-silver (In—Sb—Te—Ag) and/or chromium-antimony-selenium (Cr—Sb—Se). The second plug 170 may have the amorphous phase or the crystalline phase.

A plurality of cells may be formed within the cell region. Data may be stored in the cells. In one embodiment, the cells may extend linearly. The second plugs 170 corresponding to the respective ones of the cells may be formed. In another embodiment, the second openings 159 may be stripe-shaped. That is, each second opening 159 may linearly extend in a way substantially the same as that of the plurality of cells extends.

The second plugs 170 formed in the second openings 159 may correspond to respective ones of the cells. In one embodiment, the cells may linearly extend. In this case, the second plug 170 corresponding to the cell may have a stripe shape. That is, the second plug 170 may also linearly extend.

The conductive wire 181 is formed on the first plug 160. Thus, the conductive wire 181 may be electrically connected to the first pad 121 by the first plug 160. The conductive wire 181 may include, for example, metal or metal nitride having suitable conductivity. The metal may include, for example, aluminum and/or copper, or the like.

The second plug 170 is formed on the upper electrode 186. The second plug 170 is located between the upper electrode 186 and the lower electrode 128. Thus, the upper electrode 186 and the lower electrode 128 may be used to apply a predetermined voltage to the second plug 170 so that data may be stored.

In addition, the phase-changeable memory device 100 may further include an insulating layer pattern 136 insulating units formed in the cell region 116 and the logic region 111 from one another. The insulating layer pattern 136 may have a multi-layered structure such as a double-layered structure and a triple-layered structure. For example, the insulating layer pattern 136 may include a lower insulating layer pattern 141 and an upper insulating layer pattern 156.

In one embodiment, the second plug 170 including a phase-changeable material is formed in a second opening 159 so that the second plug 170 may not be exposed to etching processes. Thus, damage to the second plug 170 may be minimized. In addition, the second plug 170 having the phase-changeable material may be formed after the first plug 160 connected to the first pad 121 is formed. Thus, the phase-changeable material of the second plug 170 may not be exposed during etching processes that may be required for forming the first plug 160. Accordingly, damage to the second plug 170 typically caused by etching processes may be minimized. In addition, a protecting member (e.g., a hard mask pattern) for protecting the second plug 170 during etching processes may not be necessary. Thus, processes for manufacturing a semiconductor device that employs the phase-changeable material may be simplified.

The foregoing is illustrative of the present invention and is not to be construed as limiting thereof. Although a few embodiments of have been described, those skilled in the art will readily appreciate that many modifications are possible in the embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a semiconductor memory device, the method comprising:
    forming an insulating layer on a substrate including a logic region on which a first pad is provided and a cell region on which a second pad is provided to cover the first pad and the second pad, wherein the insulating layer includes a hole defined therein over the second pad and a lower electrode within the hole;
    etching the insulating layer to form a first insulating layer pattern, the first insulating layer pattern comprising a first opening defined therethrough to expose the first pad;
    forming a first plug in the first opening;
    etching the first insulating layer pattern having the first plug formed in the first opening to form a second insulating layer pattern comprising a second opening defined therethrough to expose the lower electrode;
    forming a second plug in the second opening, the second plug comprising a phase-changeable material; and
    forming a conductive wire and an upper electrode on the first plug and the second plug, respectively,
    wherein forming the second plug in the second opening comprises filling the second opening with the phase-changeable material so that a surface of the phase-changeable material is substantially coplanar with a surface of the first plug.

2. The method of claim 1, wherein the conductive wire and the upper electrode are formed simultaneously.

3. The method of claim 1, wherein forming the conductive wire and the upper electrode comprises:
    forming a conductive layer on the second insulating layer pattern, the first plug and the second plug; and
    etching the conductive layer to form the conductive wire on the first plug and the upper electrode on the second plug.

4. The method of claim 3, wherein the conductive layer comprises tungsten, titanium, titanium nitride, tantalum, tantalum nitride, molybdenum nitride, niobium nitride, titanium silicon nitride, aluminum, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride or a combination thereof.

5. The method of claim 1, wherein the insulating layer has a multi-layered structure.

6. The method of claim 5, wherein the insulating layer comprises a lower insulating layer and an upper insulating layer, the upper insulating layer having an etching selectivity with respect to the lower insulating layer.

7. The method of claim 1, wherein the lower electrode is connected to the second plug.

8. The method of claim 1, wherein a plurality of lower electrodes are connected to the second plug.

9. The method of claim 1, the second plug includes germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), tantalum-antimony-tellurium (Ta—Sb—Te), niobium-antimony-tellurium (Nb—Sb—Te), vanadium-antimony-tellurium (V—Sb—Te), tungsten-antimony-tellurium (W—Sb—Te), molybdenum-antimony-tellurium (Mo—Sb—Te), chromium-antimony-tellurium (Cr—Sb—Te), tantalum-antimony-selenium (Ta—Sb—Se), niobium-antimony-selenium (Nb—Sb—Se), vanadium-antimony-selenium(V—Sb—Se), tungsten-antimony-selenium (W—Sb—Se), molybdenum-antimony-selenium (Mo—Sb—Se), indium-antimony-tellurium-silver (In—Sb—Te—Ag), chromium-antimony-selenium (Cr—Sb—Se) or a combination thereof.

10. The method of claim 1, wherein the first plug comprises metal.

11. The method of claim 1, further comprising etching the insulating layer having the lower electrode formed in the hole to form the first insulating layer pattern.

12. A semiconductor memory device comprising:
    a substrate having a logic region and a cell region;
    a first pad disposed over the logic region;
    a second pad disposed over the cell region;
    a lower electrode disposed on the second pad;
    a first plug disposed on the first pad, the first plug including a metal; and
    a second plug disposed on the lower electrode, the second plug comprising phase-changeable material, wherein a surface of the phase-changeable material is substantially coplanar with a surface of the first plug.

13. The semiconductor memory device of claim 12, wherein an upper surface of the first pad is substantially coplanar with an upper surface of the second pad.

14. The semiconductor memory device of claim 12, wherein the lower electrode is connected to the second plug.

15. The semiconductor memory device of claim 12, further comprising a plurality of lower electrodes, wherein the plurality of lower electrodes are connected to the second plug.

16. The semiconductor memory device of claim 12, further comprising an insulating layer through which the first plug extends, the insulating layer comprising a lower layer and an upper layer over the lower layer,
   wherein a thickness of the upper layer is substantially equal to a height of the phase-changeable material.

17. The semiconductor memory device of claim 12, further comprising:
   a conductive wire on the first plug; and
   an upper electrode on the second plug.

18. A semiconductor memory device comprising:
   a substrate;
   an insulating layer pattern disposed over the substrate, the insulating layer pattern comprising:
      a lower insulating layer pattern, the lower insulating layer pattern comprising a hole and a lower opening defined therethrough; and
      an upper insulating layer pattern disposed over the lower insulating layer pattern, the upper insulating layer pattern comprising an upper opening defined therethrough in communication with the lower opening to form a first opening, the upper insulating layer pattern further comprising a second opening defined therethrough and in communication with the hole,
      wherein a width of the second opening is greater than a width of the hole, and
      wherein the insulating layer pattern comprises at least two layers having an etching selectivity with respect to each other;
   a lower electrode disposed within the hole;
   a first plug disposed within the first opening; and
   a second plug disposed within the second opening, the second plug comprising phase-changeable material extending from an upper surface of the upper insulating layer pattern toward the lower insulating layer pattern.

19. The semiconductor memory device of claim 18, wherein an upper surface of the first plug is substantially coplanar with an upper surface of the second plug.

* * * * *